(12) United States Patent
Kosaka (10) Patent No.: US 8,563,404 B2
(45) Date of Patent: Oct. 22, 2013

(54) PROCESS FOR DIVIDING WAFER INTO INDIVIDUAL CHIPS AND SEMICONDUCTOR CHIPS (75) Inventor: Toshiyuki Kosaka, Yokohama (JP)

(73) Assignee: Sumitomo Electric Device Innovations, Inc., Kanagawa (JP)

( * ) Notice: Subject to any disclaimer, the term of this patent is extended or adjusted under 35 U.S.C. 154(b) by 0 days.

(21) Appl. No.: 13/192,913

(22) Filed: Jul. 28, 2011

(65) Prior Publication Data
US 2012/0025207 A1 Feb. 2, 2012

(30) Foreign Application Priority Data

Jul. 30, 2010 (JP) ................................. 2010-172175

(51) Int. Cl.
H01L 21/76 (2006.01)
H01L 21/30 (2006.01)
H01L 21/46 (2006.01)
H01L 21/00 (2006.01)
H01L 29/15 (2006.01)
H01L 23/544 (2006.01)

(52) U.S. Cl.
USPC ........... 438/460; 438/114; 438/458; 438/459; 438/462; 257/77; 257/620

(58) Field of Classification Search
USPC ............. 257/77, E21.214, E29.104, E21.596, 257/E21.599; 438/462, 33, 68, 113, 114, 438/458, 459
See application file for complete search history.

(56) References Cited

U.S. PATENT DOCUMENTS

| 6,214,639 | B1 | 4/2001 | Emori et al. | |
| 7,795,115 | B2 * | 9/2010 | Kameyama et al. | 438/460 |
| 2008/0087634 | A1 * | 4/2008 | Kohsaka et al. | 216/41 |
| 2008/0277765 | A1 * | 11/2008 | Lane et al. | 257/622 |

* cited by examiner

Primary Examiner — Ha Tran T Nguyen
Assistant Examiner — Thai T Vuong
(74) Attorney, Agent, or Firm — Smith, Gambrell & Russell, LLP (57) ABSTRACT A process to divide a wafer into individual chips is disclosed. The process (1) etches semiconductor layers for an active device to form two grooves putting the virtual cut line therebetween, where the semiconductor wafer is to be divided along the virtual cut line; (2) etches the substrate in a region including the virtual cut line but offset from the groove from the back surface thereof so as to expose the semiconductor layers in the primary surface; and (3) etches the semiconductor layer exposed in step (2).

9 Claims, 8 Drawing Sheets

PROCESS FOR DIVIDING WAFER INTO INDIVIDUAL CHIPS AND SEMICONDUCTOR CHIPS

BACKGROUND OF THE INVENTION

1. Field of the Invention

The present invention relates to a manufacturing process of a semiconductor electronic device, in particular, a process for compound semiconductor material.

2. Related Prior Arts

Various processes have been known for dividing a processed semiconductor wafer into individual chips by dicing and so on. For instance, the United States Patent, U.S. Pat. No. 6,214,639, has disclosed a process to form grooves and through holes in the scribe region that demarcates individual chips on the wafer so as to leave a limited portion in the scribe as tying bars connecting and supporting chips. Breaking the tying bars, the respective chips may be easily obtained.

Another process to divide the wafer into respective chips has been known in which the process etches along a region in the back surface of the wafer corresponding to the scribe region of the top surface, then the process divides the wafer along the scribe region. In such a process including an etching of the wafer, it is inevitable to fix and support the wafer to be divided. The process ordinarily puts the wafer on a support substrate, such as a glass plate, with resin adhesive.

However, the etching of the wafer sometimes causes a crack in the thinned wafer or the semiconductor layers grown on the wafer. The reason for causing the crack is due to a stress induced therein by an internal force accumulated in the wafer and/or the softened adhesive. The crack extends in random directions, and sometimes reaches a device region formed in the primary surface of the wafer, which directly results in the reduction of the reliability of the device.

SUMMARY OF THE INVENTION

An aspect of the present invention relates to a process to divide a semiconductor wafer into individual chips, where the semiconductor wafer includes a substrate and a semiconductor layer formed on a primary surface of the substrate. The process according to an embodiment of the invention includes steps of: (a) removing a portion of the semiconductor layer to form a groove between a virtual cut line and a device region; (2) first etching the substrate in a portion including the virtual cut line but offset from the groove to expose the semiconductor layer; and (3) second etching the semiconductor layer in a portion thereof exposed by the first etching to divide the wafer into the individual chips, where the wafer is to be divided along the virtual cut line, and an active device is formed in the semiconductor layer of the device region.

The groove formed in the semiconductor layer of the scribe region may effectively prevent a crack, which is occasionally induced during the etching of the substrate from the back surface thereof, from extending into/reaching to the device region.

Another aspect of the present invention relates to a semiconductor chips that includes a semiconductor substrate and a semiconductor layer arranged on the semiconductor substrate. The substrate includes a device region that arranges a semiconductor active device in the semiconductor layer and a scribe region. A feature of the semiconductor chips of the present invention is that the semiconductor layer includes a groove in the scribe region. This groove extends along a periphery of the semiconductor chips and surrounds the device region. Moreover, the groove has a function to prevent cracks occasionally induced during the etching of the semiconductor substrate from the back surface thereof from extending and reaching to the device region.

BRIEF DESCRIPTION OF THE DRAWINGS

The invention will be described in conjunction with the accompanying drawings, in which.

DETAILED DESCRIPTION OF PREFERRED EMBODIMENTS

Next, some preferred embodiment according to the present invention will be described in detail. In the description of the drawings, the same numerals or symbols will refer to the same elements without overlapping explanations.

Figure 1:
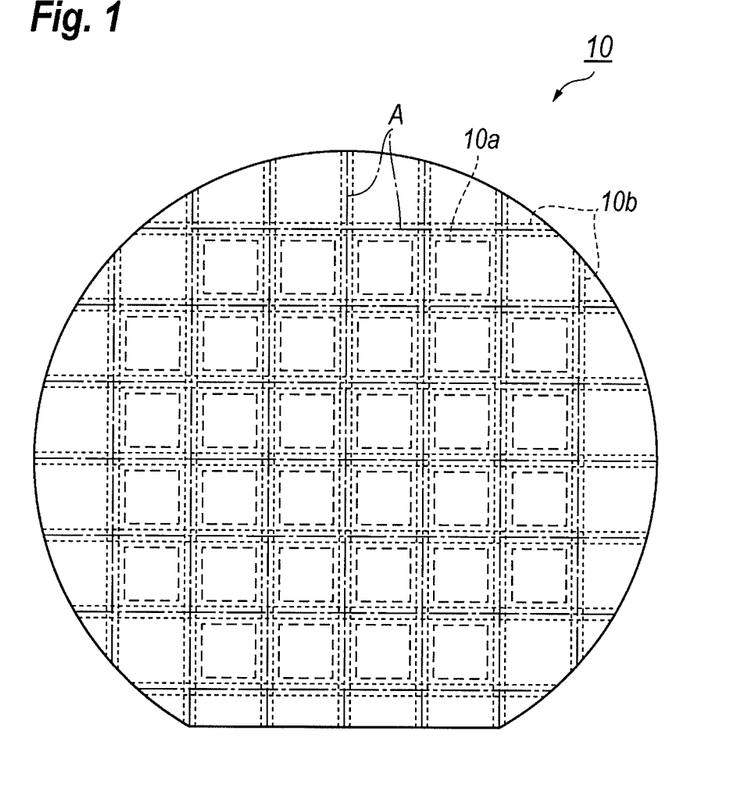
FIG. 1 is a plan view of a wafer before it is divided into individual chips.

The process described below, which is an embodiment of the present invention, includes a step for dicing a wafer made of silicon carbide (SiC), on which a plurality of device elements is formed, into respective chips. FIG. 1 is a plan view of the wafer 10 before it is divided into individual chips. The wafer 10 includes a plurality of chip regions 10a arranged in two-dimensional with scribe regions 10b therebetween. The scribe regions 10b cover a virtual cut line A along which the wafer 10 will be divided.

FIGS. 2 to 5 are cross sections showing the process according to the present invention. Next, the manufacturing process according to an embodiment of the invention will be described in step by step.

(Formation of Semiconductor Layers)

Figure 2A:
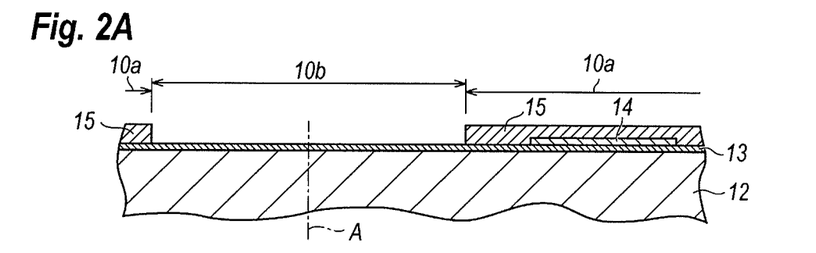
FIGS. 2A to 2D sequentially show processes to divide the wafer according to an embodiment of the present invention.

First, the process epitaxially grows a semiconductor layer 13 on a primary surface 12a of the substrate 12, as shown in FIG. 2A. The semiconductor substrate 12 may be made of SiC, while, the semiconductor layer 13 may include a layer made of gallium nitride (GaN). The semiconductor layer 13 may provide a function of an etching stopper against the substrate 12, that is, the etching rate thereof is far less than that of the substrate 12. In a modified embodiment, the semiconductor layer 13 may have a multi-layered structure including a plurality of semiconductor layers.

(Formation of Semiconductor Device)

Subsequently, the process may form a device structure on the device region 10a in the primary surface 12a of the substrate 12; then forms pad metal 14 on the semiconductor layer 13. The pad metal 14, which will be connected to an interconnection within a via hole to be formed in a later step, maybe formed in an optical position within the device region 10a.

The process subsequently forms a passivation film 15 so as to cover a whole primary surface 12a of the substrate 12. The passivation film may be made of silicon nitride (SiN). The passivation film 15 on the scribe region 10b is removed.

(Formation of Groove)

Figure 2B:
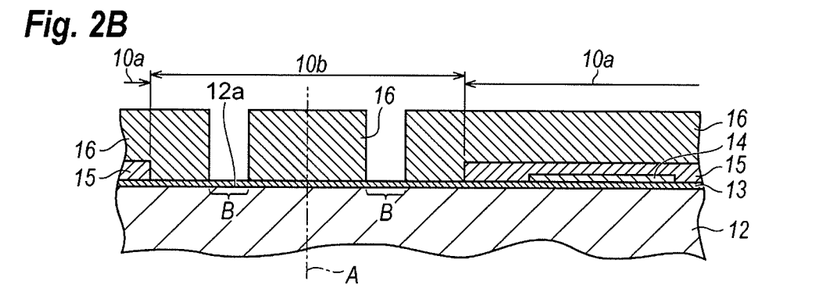
Figure 2C:
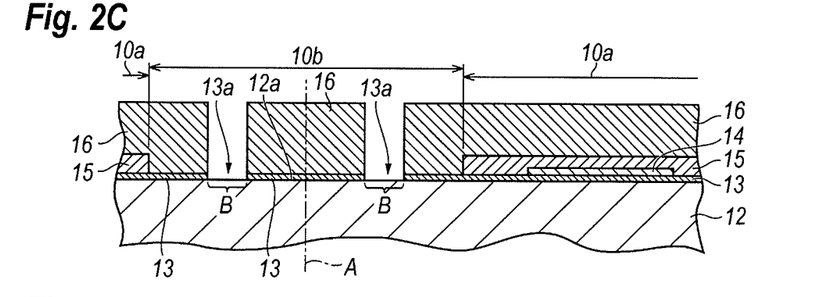

The process next forms a groove. Coating a resist on the whole surface of the semiconductor layer 13 and patterning the resist 16 so as to remove regions B by an ordinary photolithography technique, as shown in FIG. 2B. The regions B is along and in parallel to the virtual cut line A and positions between the virtual cut line A and the device region 10a. The process sets two regions B so as to put the virtual cut line A therebetween. Next, the process etches the semiconductor layer 13 by the patterned resist 16 as an etching mask, which may form two grooves 13a along the virtual cut line A in the semiconductor layer 13, which is shown in FIG. 2C. The grooves 13a in the arrangement thereof trace the region B in the patterned resist 16, and put the virtual cut line A therebetween. When the virtual cut line A only adjoins the device region 10a only in one side thereof, the groove 13a may be formed only in the side where the device region 10a is formed.

Figure 2D:
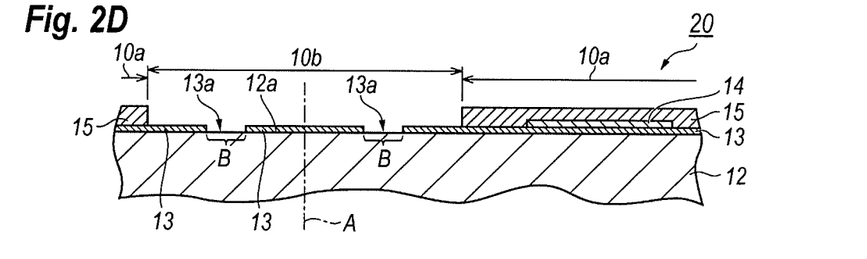

The groove 13a is also in parallel to the virtual cut line A. The patterned resist 16 is removed after the formation of the groove 13a. The etching to form the groove 13a may stop in halfway of the semiconductor layer 13, or fully remove the semiconductor layer 13 to expose the surface of the substrate 12 or to etch the semiconductor substrate 12 slightly. In other words, the groove 13a may have a depth less than, equal to, or slightly greater than a thickness of the semiconductor layer 13. After removing the patterned resist 16, the wafer 20 includes the substrate 12, the semiconductor layer 13 with the groove 13a on the primary surface 12a of the substrate 12, the pad metal 14 in the device region 10a, the passivation film 15, and the device structure in the device region 10, as shown in FIG. 2D.

(Thinning Substrate)

Figure 3A:
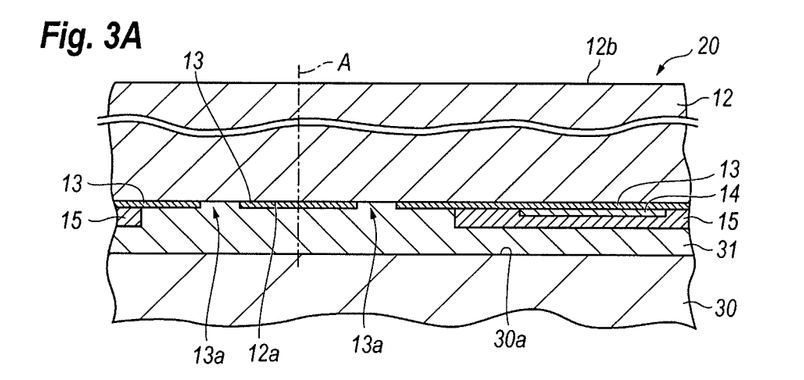
FIGS. 3A to 3C sequentially show processes subsequent to the process shown in FIG. 2D of the embodiment of the invention.
Figure 3B:
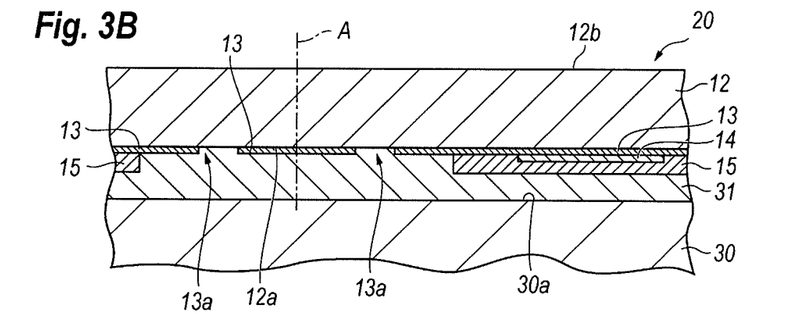

Next, the process puts the wafer 20 on a support substrate 30 so as to face the primary surface 12a of the substrate 12 to the support substrate 30, as shown in FIG. 3A. Specifically, coating the whole surface 30a of the support substrate 30 with adhesive layer 31, the wafer 20 is put on the adhesive layer 31 so as to face the primary surface 12a of the substrate 12 faces the primary surface 30a of the support substrate 30. The adhesive layer 31 may be made of resin soluble for an organic solvent, and have a thickness of about 10 µm. The support substrate 30 may be glass, preferably heat-resisting glass, sapphire, silica glass, or SiC. Then, the process thins the substrate 12 by polishing the back surface 12b thereof (FIG. 3B) to a thickness of about 100 µm.

(Formation of Metal Mask)

Figure 3C:
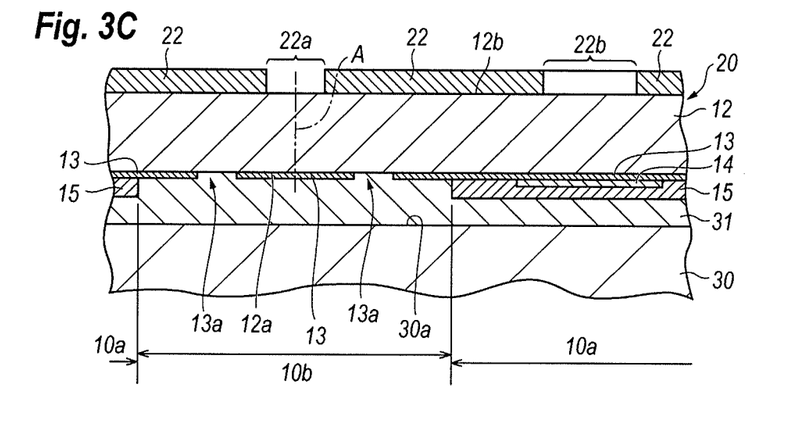

Next, the process forms a metal mask 22 on the back surface 12b of the substrate 12 (FIG. 3C). Specifically, first forming a seed metal, which may be made of a stacked metal of titanium (Ti) and gold (Au), on the back surface 12b of the substrate 12, then forming a patterned resist on the seed metal, the process forms the patterned metal mask 22 by the plating. The patterned resist provides openings into which the metal mask 22 is formed. Removing the patterned resist then etching the seed metal covered by the patterned resist, the metal mask 22 may be formed on the back surface 12b of the substrate 12. The metal mask may include at least one of nickel (Ni) and chromium (Cr). In the present embodiment shown in FIG. 3C, the metal mask 22 is made of Ni.

The metal mask 22 thus prepared has openings, 22a and 22b, the formed of which exists in a region where the substrate 12 is to be etched in a later process; that is, the opening 22a includes and extends along the virtual cut line A in the scribe region 10b. One side of the opening 22a exists between the groove 13a of the semiconductor layer 13 and the virtual cut line A. While, another opening 22b is formed in the device region 10a, which is to be converted to the via hole formed in the substrate 12.

(First Etching)

Figure 4A:
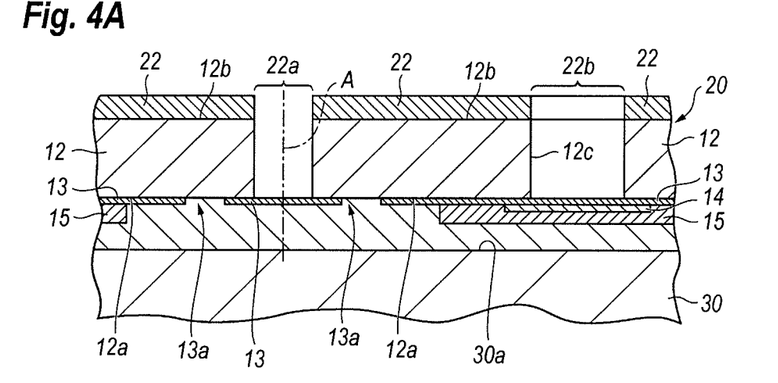
FIGS. 4A and 4B sequentially show processes subsequent to the process shown in FIG. 3C of an embodiment of the invention.
Figure 4B:
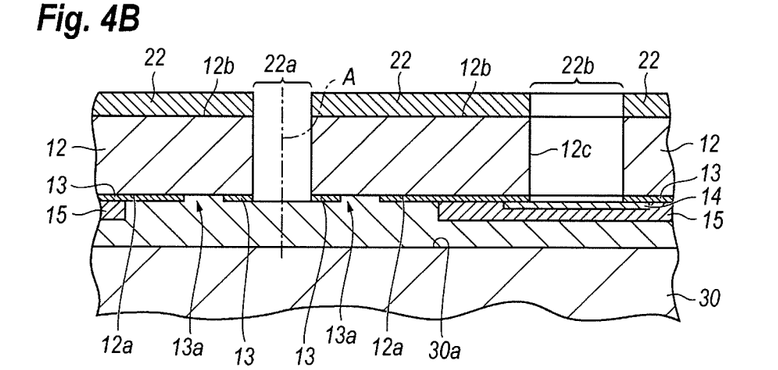

Next, the process etches the substrate 12 by the metal mask 22 as an etching mask, that is, the process etches portions of the substrate 12 exposing in the openings, 22a and 22b, not only to divide the substrate 12 but to form the via hole 12c (FIG. 4A). The etching is carried out from the back surface 12b of the substrate 12 to the semiconductor layer 13. Because the etching rate of the semiconductor layer 13 is far less than that of the substrate 12, the etching may be stopped just after the semiconductor layer 13 exposes. The opening 22a covers the virtual cut line A, accordingly, the process may etch the substrate 12 including the virtual cut line A.

The induction coupled plasma (ICP) etching may carry out the process of the first etching. An electron cyclotron resonance (ECR) etching may also carry out this etching process. For the ICP etching, following conditions are preferably adopted. That is:

Etching Gas: a mixture of $NF_3$ and $O_2$, or $SF_6$ and $O_2$
Etching Pressure: 0.5 to 2.0 Pa
ICP power: greater than 2 kW
RF power: 150 to 500 W For the ECR etching, almost same conditions are preferable except that the ECR power is greater than 1500 W.

(Second Etching)

Continuous to the first etching described above, the process carries out the second etching, which etches the semiconductor layer 13 exposed by the first etching. The ICP etching maybe also applied for the second etching, but the conditions thereof are preferably changed to:

Etching Gas: $SiCl_4$
Etching Pressure: 2.0 to 5.0 Pa
ICP Power: 1 kW
RF Power: 15 to 50 W For the ECR Etching, the ECR power of about 700 W may be preferably applied with the same conditions to those of the conditions of the ECR etching above described. The second etching is moderate compared to the first etching so as not to etch the resin adhesive 31 excessively. This moderate etching of the resin adhesive 31 may suppress the degradation thereof and prevent the wafer from being detached from the support substrate 30.

Because the first etching etches the region including the virtual cut line A, the second etching also etches a region including the virtual cut line A. In an alternative process, the first and second etchings may carry out in fully continuous without distinguishing the etching gas which may etch both the semiconductor substrate 12 and the semiconductor layer 13.

Figure 5A:
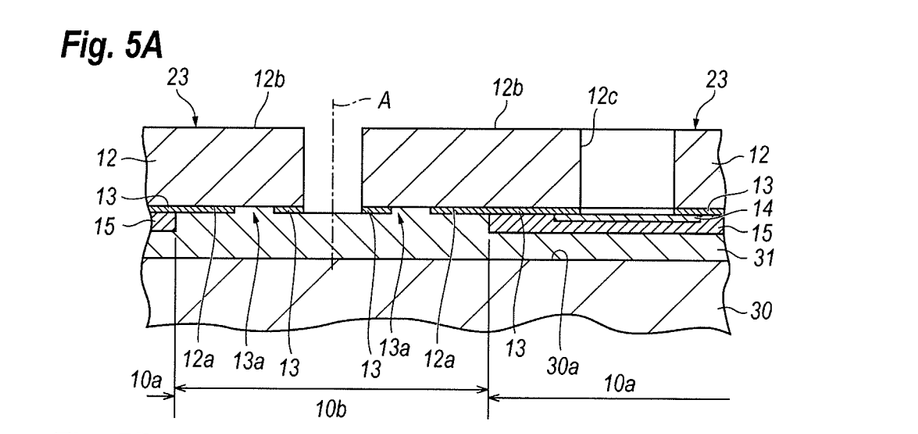
FIGS. 5A to 5C sequentially show processes subsequent to the process shown in FIG. 4B according to an embodiment of the invention.

After the second etching and removing the metal mask 22, the wafer 20 is fully divided into respective chips 23 each including the device region 10a (FIG. 5A). The via hole 12c penetrates from the back surface 12b of the substrate 12 to the pad metal 14 without any semiconductor material therein so as to exposed the pad metal.

(Formation of Back Metal)

Figure 5B:
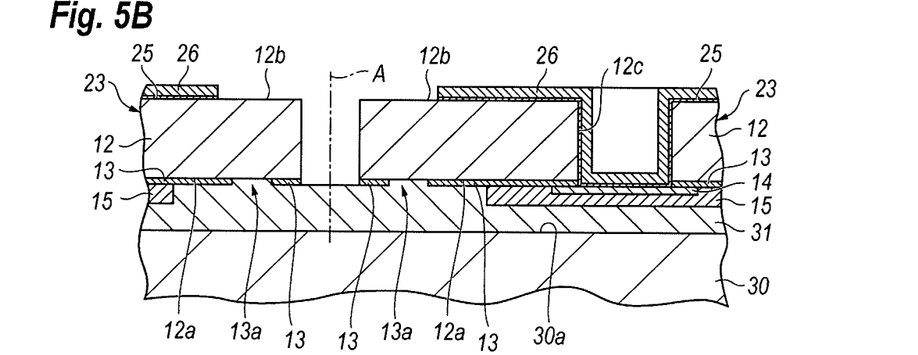

Subsequently, the process forms the back metal 26 as shown in FIG. 5B. Specifically, preparing a seed metal 25 on the back surface 12b of the substrate 12, the inner surface of the via hole 12c, and side surfaces of respective chips 23 first, covering portions of the back surface 12b putting the virtual cut line A therebetween and the side surfaces of the chips 23 by a patterned resist second, where the photo resist exposes the primary portion of the back surface 12b of the substrate 12 and the via hole 12c; then the process plates a metal film 26. Removing the patterned resist and the seed metal 25 in a portion covered by the patterned resist, namely, a portion out of the plated metal 26, the process may complete the formation of the back metal 26 (FIG. 5B). The back metal 26 formed within the via hole 12c becomes the interconnection between the pad metal on the primary surface 12a and the back surface 12b of the substrate 12.

(Detaching Chips)

Figure 5C:
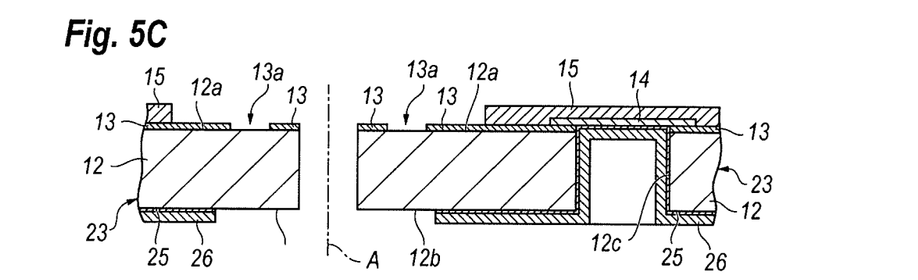
Figure 6:
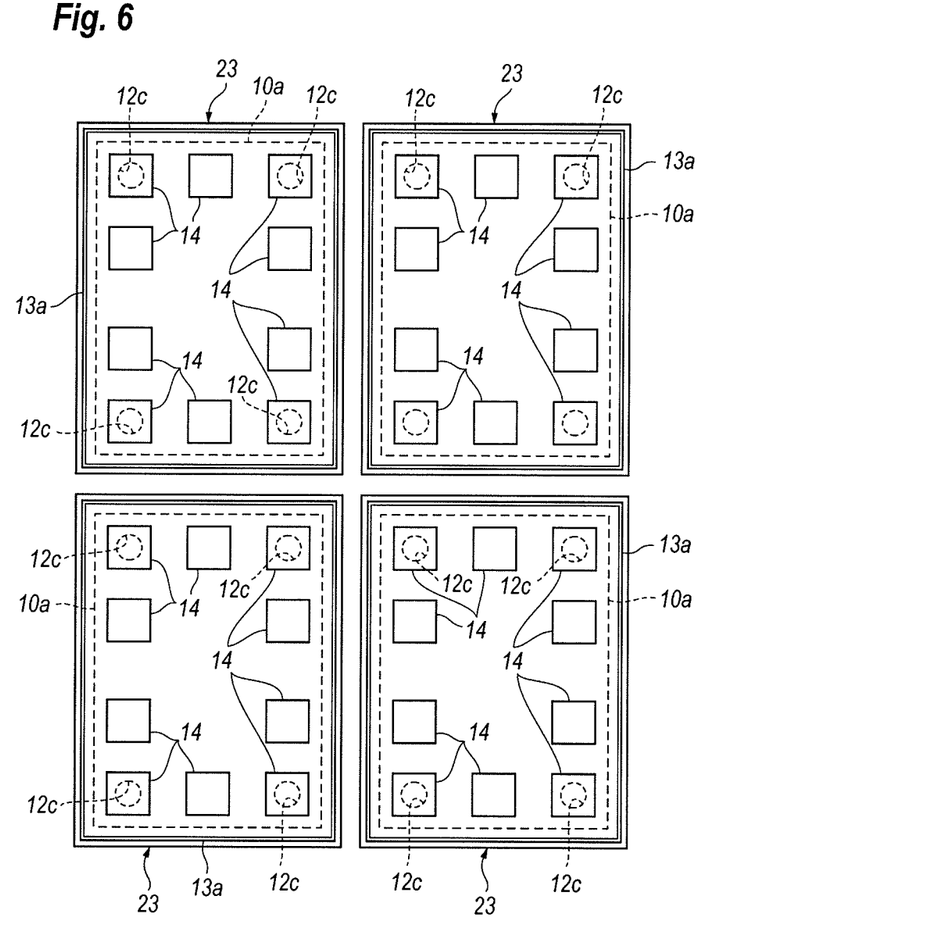
FIG. 6 is a plan view showing a plurality of chips each processed by the process of the invention shown in FIGS. 2A to 5C.

Next, the process may detach respective chips 23 from the support substrate 30 (FIG. 5C). FIG. 6 is a plan view showing a plurality of chips 23 thus processed. Respective chips 23 include one device region 10a with the pad metal 14. The plane shape of the device region 10a is rectangular whose edges run along the edge of the chip 23 and surround the device region 10a.

Figure 7A:
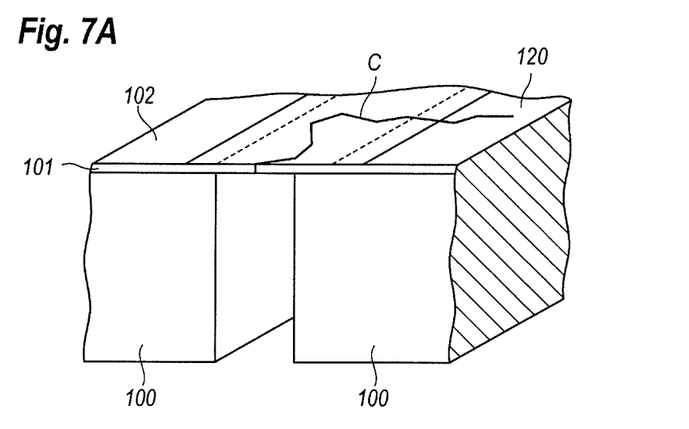
FIGS. 7A and 7B schematically show a crack induced during the etching of the semiconductor substrate in an conventional process.
Figure 7B:
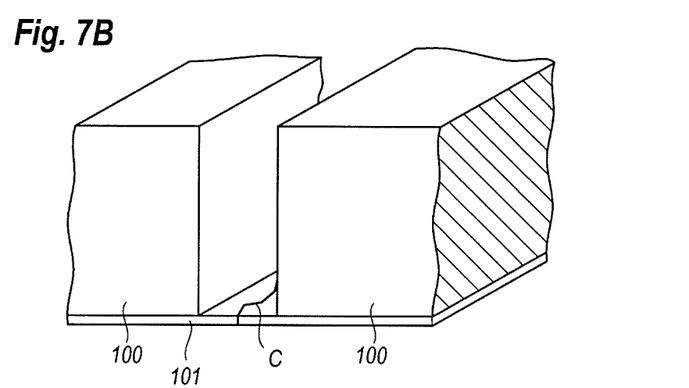

Advantages according to the present embodiment will be described as comparing it with subjects inherently attributed to conventional processes. The conventional process puts the wafer on the support substrate to divide the wafer into individual chips interposing a resin adhesive between the wafer and the support substrate; then etches the back surface of the wafer until the device layer formed in the primary surface of the wafer exposes. However, the conventional process often induces cracks in the device layer during the etching. FIGS. 7A and 7B schematically illustrate the cracks induced in the device layer 101. FIG. 7A shows the primary surface of the wafer 100, while, FIG. 7B is viewed from the back surface of the wafer. Because the crack randomly extends, it occasionally reaches to and invades into the device region 120. Once reaching cracks to the device region 120, the reliability of the device remarkably degrades.

Figure 8A:
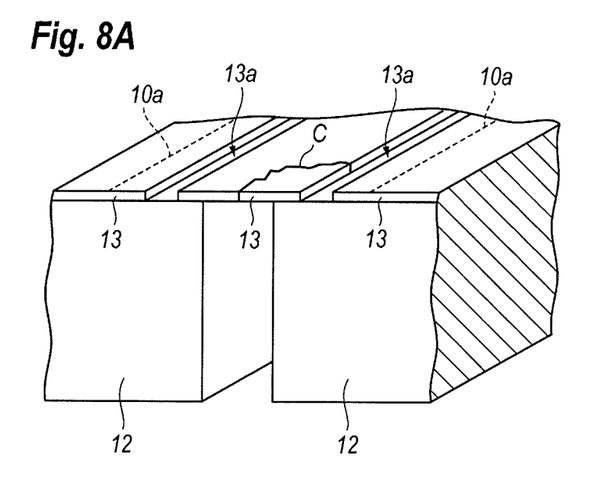
FIGS. 8A and 8B schematically illustrate how the crack induced during the etching of the substrate is terminated by the groove arranged in the semiconductor layer, where FIG. 8A corresponds to a case the groove has a depth substantially equal to a thickness of the semiconductor layer; while, FIG. 8B corresponds to another case the groove has a depth less than the thickness of the semiconductor layer.
Figure 8B:
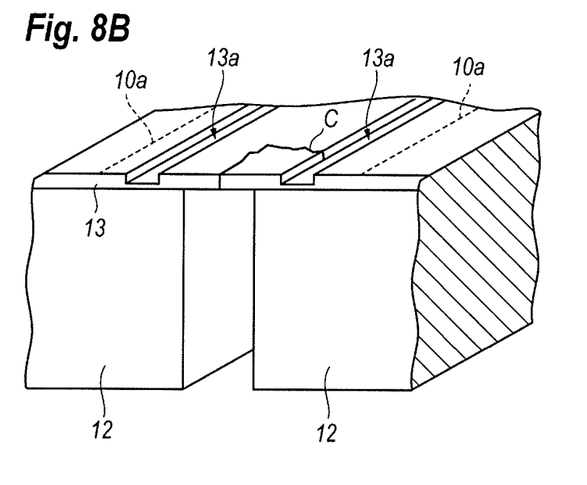

Comparing the process according to the present invention with such a conventional process, the present process forms grooves 13a in the semiconductor layer 13. FIGS. 8A shows a process where the groove 13a has the depth equal to the thickness of the semiconductor layer 13, that is, the etching to form the groove 13a fully removes the semiconductor layer 13; while, FIG. 8B shows a process where the groove 13a has a depth less than the thickness of the semiconductor layer 13, that is, the etching is halfway stopped.

Accordingly, even the etching induces the crack in the semiconductor layer 13, the groove 13a may effectively prevent the crack C from extending and reaching to the device region 10a. The process according to the present invention may prevent or suppress the crack C, which is induced in the semiconductor layer 13 during the etching of the wafer 20 from the back surface 12b thereof, from extending to the device region 10a. The groove 13a in the semiconductor layer 13 preferably exits between the virtual cut line A and the device region 10a. Even when the groove 13a is formed in or partially formed in the device region 10a, the function to prevent the cracks from extending may be maintained as far as an area in which the device is practically formed therein is isolated by the groove 13a.

The process preferably forms the device structure in the primary surface 12a of the substrate 12 in advance to form the groove 13a in the semiconductor layer 1, because the process to form the device structure buries the groove 13a when the latter process precedes the former process. Even if the latter process to form the groove 13a precedes the former process to form the device, an additional step to dig up the groove 13a may recover the function of the groove 13a.

The substrate 12 may be made of SiC, the semiconductor layer 13 may be GaN, a combination of which may enhance the ratio of the etching rate of the substrate 12 to that for the semiconductor layer 13 at the process of the first etching.

While the present invention has been fully described as referring to the preferred embodiment thereof and the accompanying drawings, it is to be understood that various changes and modifications may be apparent to those skilled in the art. For instance, the embodiment shows the substrate made of SiC; while, the substrate may be made of other material or material showing semi-insulating characteristic. Further, the embodiment shows the semiconductor layer made of GaN; while, the present invention may have other material as far as those materials show an etching rate far greater than that of the substrate. Such changes and modifications are to be understood as included within the scope of the present invention as defined by the appended claims, unless they depart therefrom.

What is claimed is:

1. A process to divide a semiconductor wafer into individual chips, the semiconductor wafer including a substrate having a primary surface and a back surface opposite the primary surface, and a semiconductor layer on the primary surface, the process comprising steps of:

removing a portion of the semiconductor layer to form a groove between a virtual cut line along which the wafer is to be divided and a device region at which a semiconductor active device is arranged, and to expose the primary surface of the substrate within the groove;

first etching the substrate from the back surface thereof in a portion including the virtual cut line but offset from the groove to expose the semiconductor layer; and second etching the semiconductor layer in a portion exposed by the first etching to divide the wafer into individual chips.

2. The process of claim 1, further including a step of, after forming the groove but before the first etching, putting the wafer on a support substrate with an adhesive such that the primary surface of the substrate faces the support substrate.

3. The process of claim 2, further including a step of, after putting the wafer on the support substrate but before the first etching, forming a metal mask on the back surface of the substrate, wherein the metal mask has an opening along the virtual cut line but offset from the groove.

4. The process of claim 1, further including steps of, forming a pad metal on the semiconductor layer in the device region before forming the groove in the semiconductor layer, and forming a via hole in the device region during the first etching and the second etching, the via hole reaching the pad metal from the back surface of the substrate.

5. The process of claim 1, further including a step of, after forming the groove but before first etching the substrate, thinning the substrate to a thickness of about 100 μm.

6. The process of claim 1, wherein the process of the first etching for the substrate is substantially stopped by the semiconductor layer.

7. The process of claim 1, wherein the first etching and the second etching are sequentially carried out by an induction coupled plasma (ICP) etching.

8. The process of claim 1, wherein the first etching and the second etching are sequentially carried out by an electron cyclotron resonance (ECR) etching.

9. The process of claim 1, wherein the substrate is made of silicon carbide (SiC), and the semiconductor layer is made of gallium nitride (GaN).

* * * * *